(12) United States Patent
Qi et al.

(10) Patent No.: US 9,431,539 B2
(45) Date of Patent: Aug. 30, 2016

(54) DUAL-STRAINED NANOWIRE AND FINFET DEVICES WITH DIELECTRIC ISOLATION

(71) Applicant: GLOBALFOUNDRIES Inc., Grand Cayman (KY)

(72) Inventors: Yi Qi, Niskayuan, NY (US); Catherine B. Labelle, Schenectady, NY (US); Xiuyu Cai, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 133 days.

(21) Appl. No.: 14/511,715

(22) Filed: Oct. 10, 2014

(65) Prior Publication Data

US 2016/0104799 A1 Apr. 14, 2016

(51) Int. Cl.
| | |
|---|---|
| *H01L 21/00* | (2006.01) |
| *H01L 21/84* | (2006.01) |
| *H01L 29/78* | (2006.01) |
| *H01L 27/12* | (2006.01) |
| *H01L 29/10* | (2006.01) |
| *H01L 29/06* | (2006.01) |
| *H01L 29/775* | (2006.01) |
| *H01L 29/423* | (2006.01) |
| *H01L 21/762* | (2006.01) |
| *H01L 29/66* | (2006.01) |

(52) U.S. Cl.
CPC ..... *H01L 29/7849* (2013.01); *H01L 21/76224* (2013.01); *H01L 21/845* (2013.01); *H01L 27/1211* (2013.01); *H01L 29/0653* (2013.01); *H01L 29/0673* (2013.01); *H01L 29/1054* (2013.01); *H01L 29/42392* (2013.01); *H01L 29/6656* (2013.01); *H01L 29/66439* (2013.01); *H01L 29/66545* (2013.01); *H01L 29/66818* (2013.01); *H01L 29/775* (2013.01)

(58) Field of Classification Search
USPC .......................... 438/154, 222; 257/192, 369
See application file for complete search history.

(56) References Cited

U.S. PATENT DOCUMENTS

| | | | | |
|---|---|---|---|---|
| 9,171,904 | B2 * | 10/2015 | Eneman | ............... H01L 29/1054 |
| 2011/0018065 | A1 * | 1/2011 | Curatola | ................ B82Y 10/00 |
| | | | | 257/368 |
| 2014/0151766 | A1 * | 6/2014 | Eneman | ............... H01L 29/1054 |
| | | | | 257/288 |
| 2014/0217502 | A1 * | 8/2014 | Chang | ..................... H01L 29/78 |
| | | | | 257/347 |
| 2014/0353717 | A1 | 12/2014 | Loubet et al. | |

(Continued)

OTHER PUBLICATIONS

Ok et al. "Strained SiGe and Si FinFETS for High Performance Logic with SiGe/Si stack on SOI", 2010, IEEE, pp. 32.2.1-34.2.1.*

(Continued)

*Primary Examiner* — Telly Green
(74) *Attorney, Agent, or Firm* — Ditthavong & Steiner, P.C.

(57) ABSTRACT

A dual-strained Si and SiGe FinFET device with dielectric isolation and a dual-strained nanowire device and methods of forming them are provided. Embodiments include a SiGe SRB formed on a silicon substrate, the SRB having a first region and a second region; a first and a second dielectric isolation layer formed on the first region and on the second region of the SiGe SRB, respectively; a tensile strained Si fin formed on the first dielectric isolation layer; a compressive strained SiGe fin formed on the second dielectric isolation layer; first source/drain regions formed at opposite sides of the tensile strained Si fin; second source/drain regions formed at opposite sides of the compressive strained SiGe fin; a first RMG formed between the first source/drain regions; and a second RMG formed between the second source/drain regions.

13 Claims, 20 Drawing Sheets

(56) References Cited

U.S. PATENT DOCUMENTS

| | | |
|---|---|---|
| 2014/0353718 A1 | 12/2014 | Loubet et al. |
| 2015/0194307 A1* | 7/2015 | Gaire .................. H01L 27/0924 257/190 |
| 2016/0027777 A1* | 1/2016 | Eneman .............. H01L 29/1054 257/192 |
| 2016/0064288 A1* | 3/2016 | Cheng .................. H01L 29/165 257/192 |

OTHER PUBLICATIONS

Orlowski et al. "Si, SiGe, Ge, and III-V Semiconductor Nanomembranes and Nanowires Enabled by SiGe Epitaxy", The Electrochemical Society, Feb. 19, 2011, pp. 777-789.*

T. Skotnicki et al., "Emerging Silicon-On-Nothing (SON) Devices Technology", Electromechanical Society Proceedings vol. 2003-5, pp. 133-148.

* cited by examiner

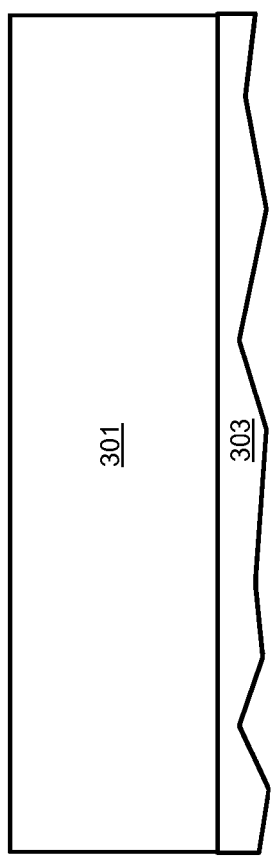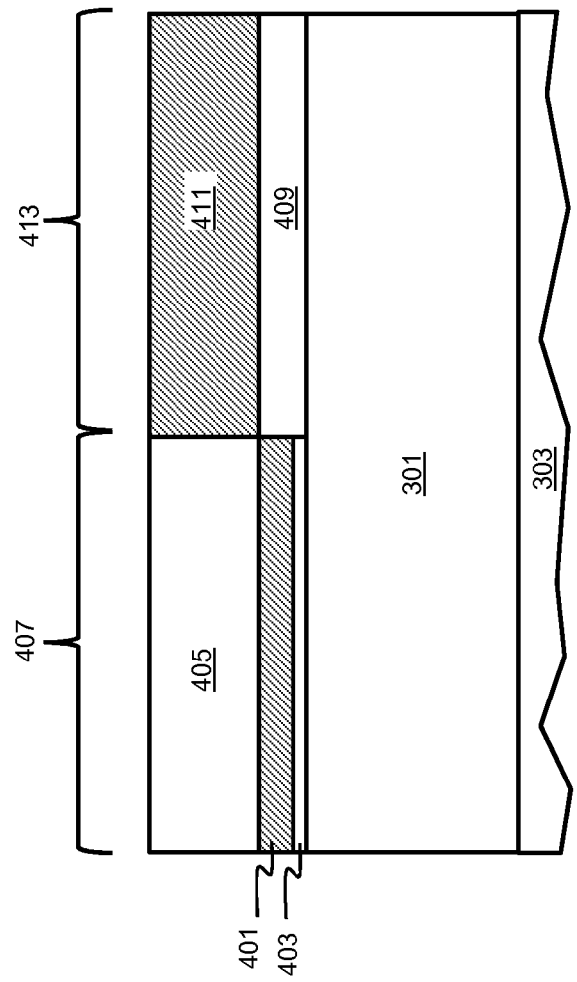

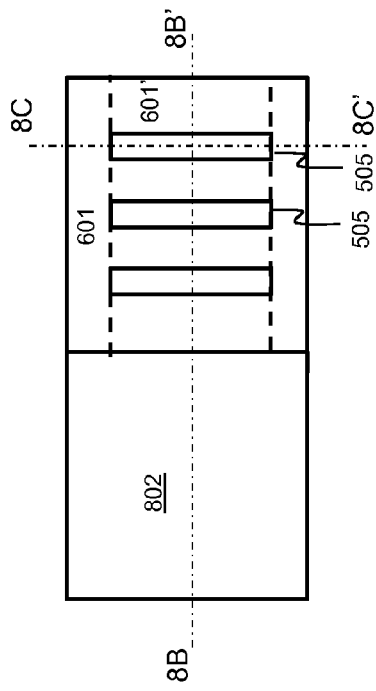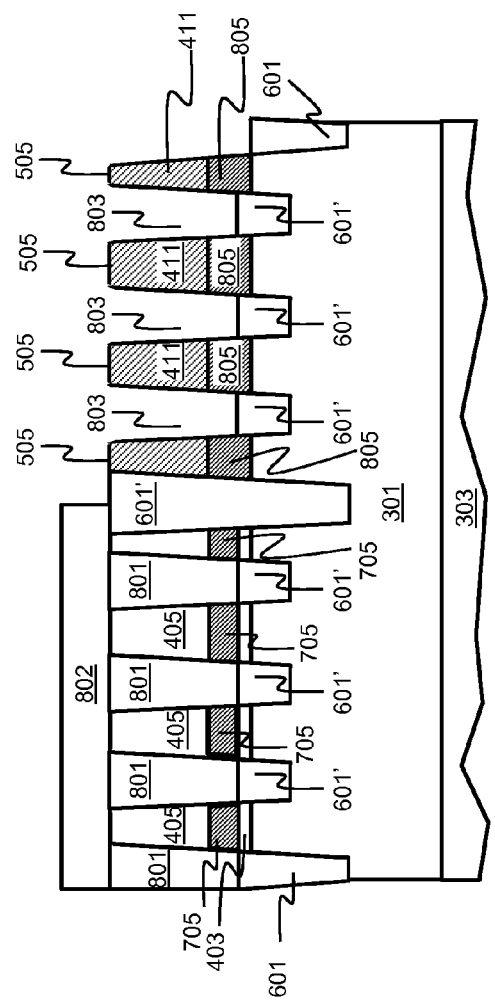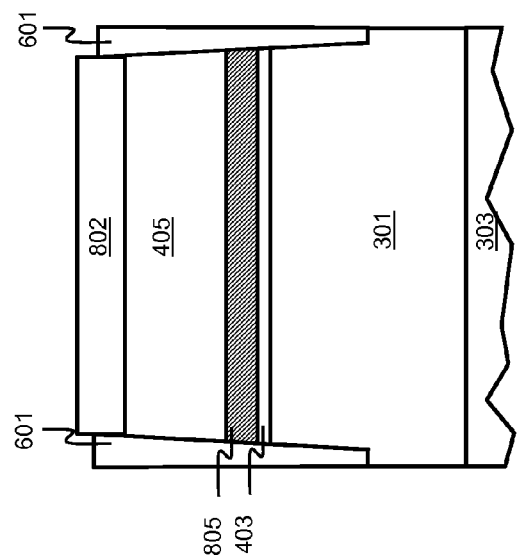
FIG. 8A
FIG. 8B
FIG. 8C

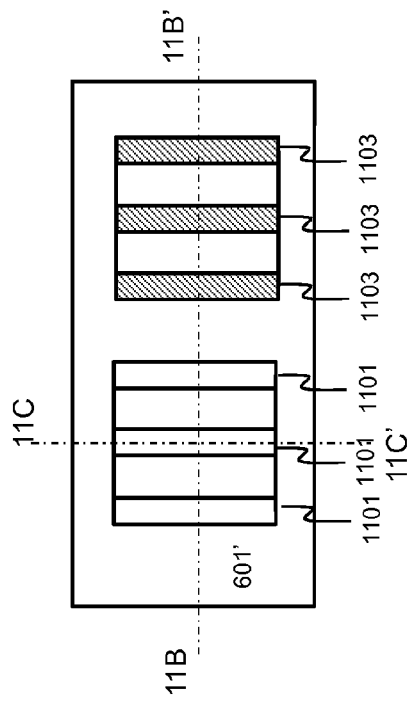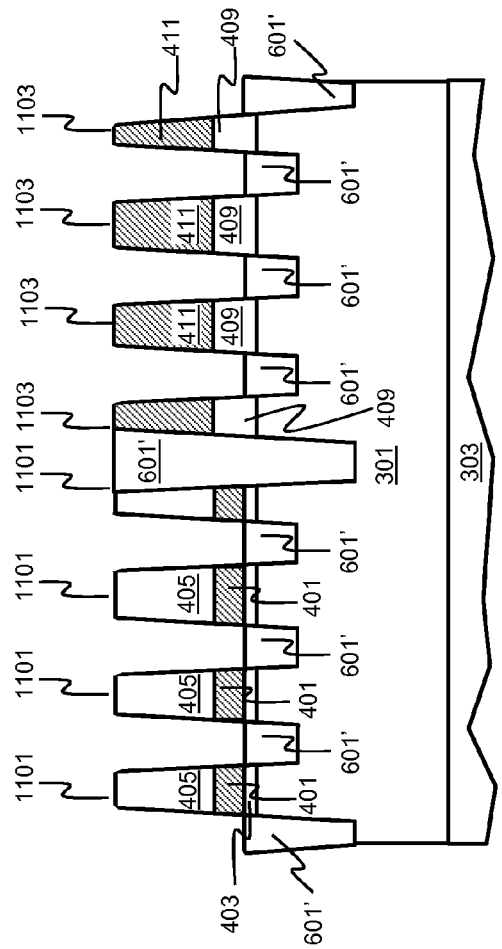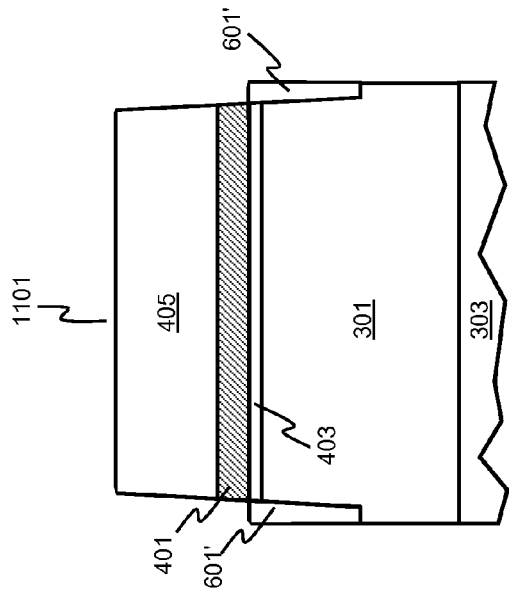
FIG. 11A
FIG. 11B
FIG. 11C

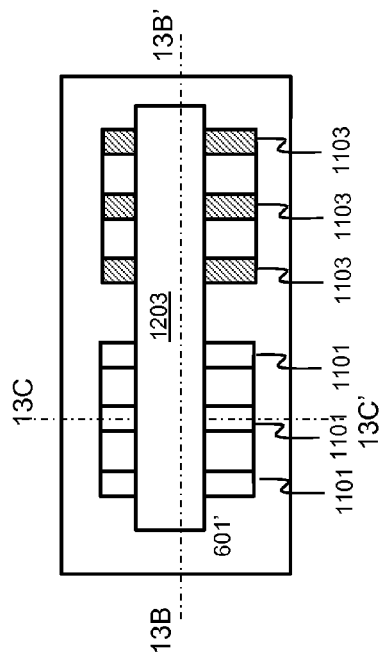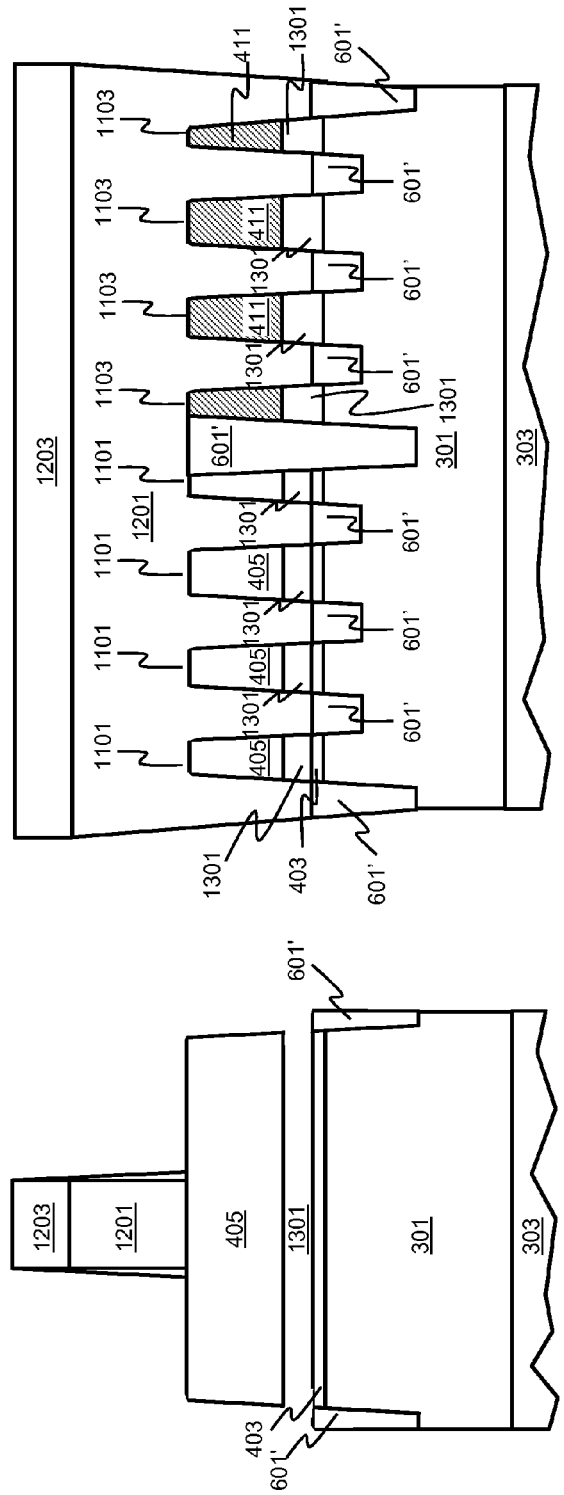

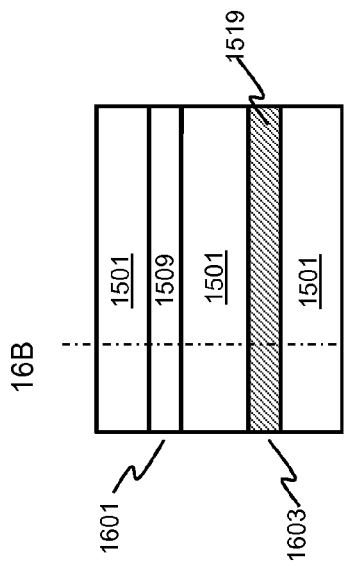
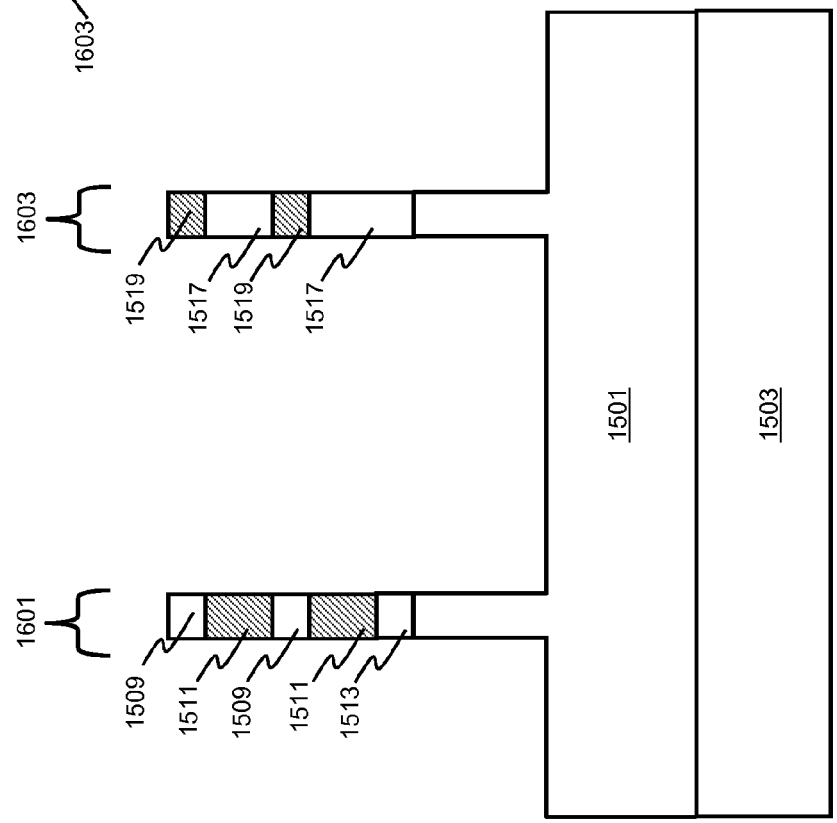

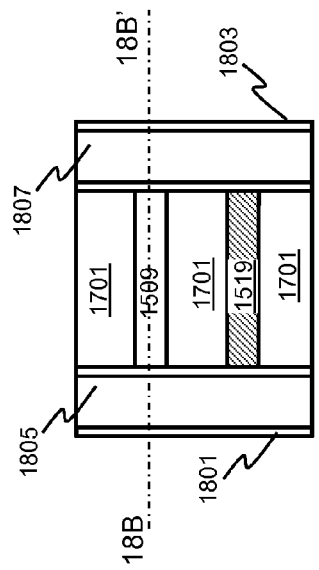
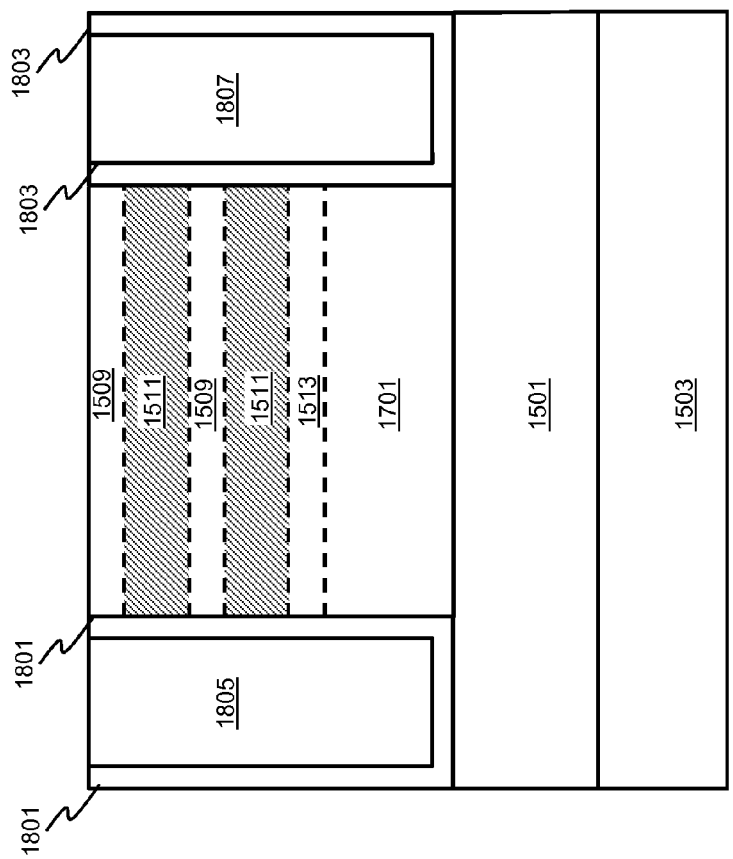
FIG. 18A
FIG. 18B

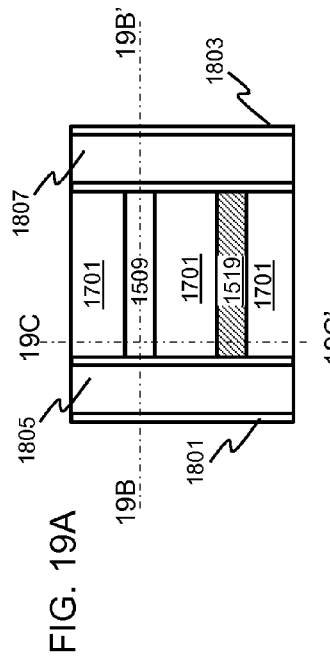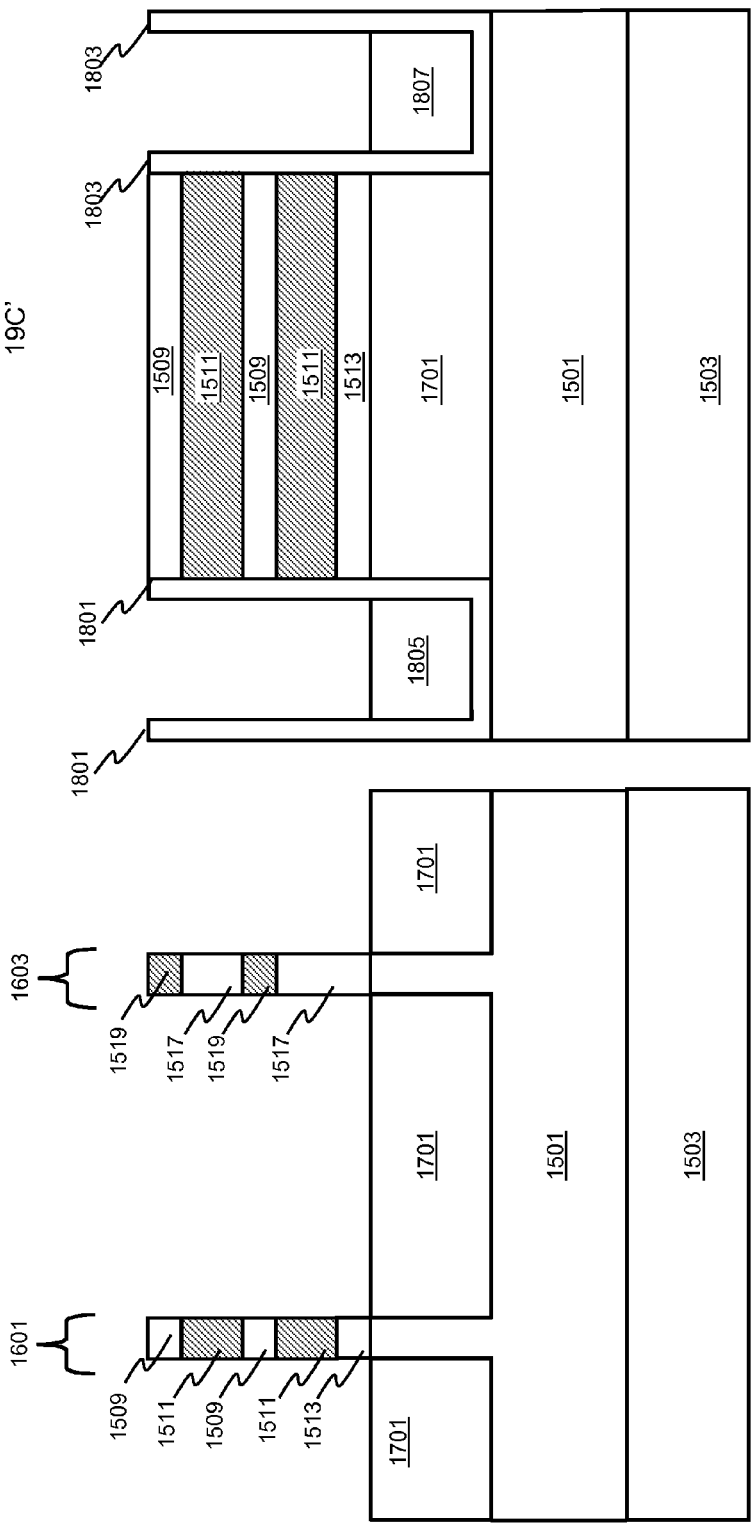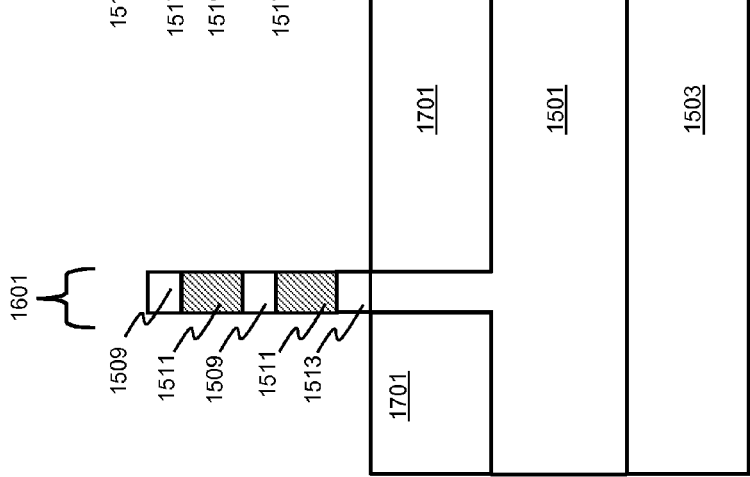

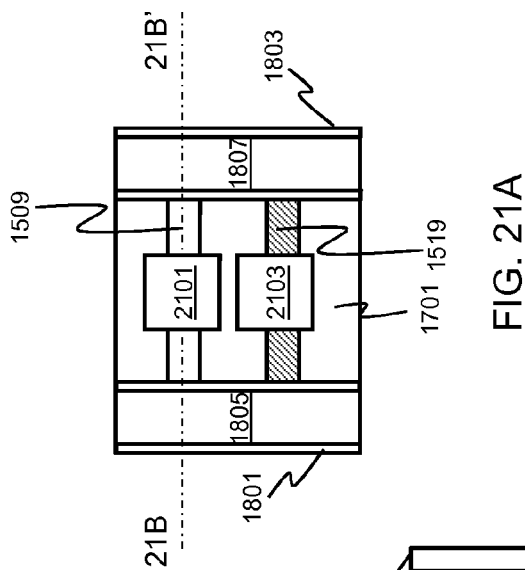
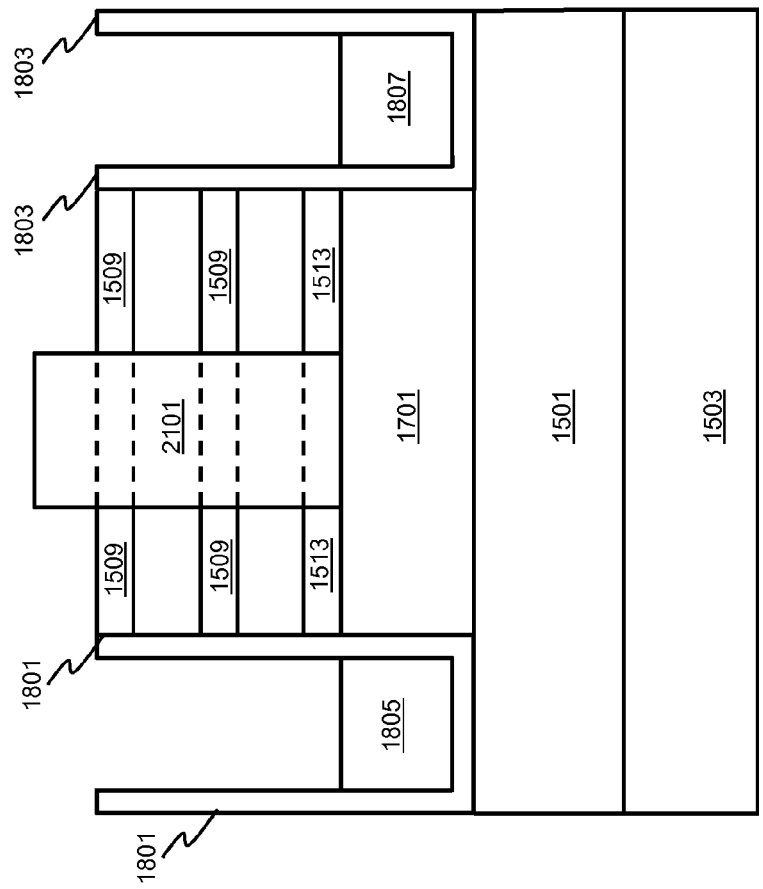
FIG. 21A
FIG. 21B

DUAL-STRAINED NANOWIRE AND FINFET DEVICES WITH DIELECTRIC ISOLATION

TECHNICAL FIELD

The present disclosure relates to methods of manufacturing semiconductor devices with strain relaxed buffers (SRBs). The present disclosure is particularly applicable to 7 nanometer (nm) technology nodes and beyond.

BACKGROUND

For 7 nm technology nodes, a number of device options have been considered for forming a Fin-type field effect transistor (FinFET). For example, a single channel formed of a high-germanium (Ge) content silicon germanium (SiGe) n-type metal-oxide-semiconductor (nMOS) 101 and a high-Ge content SiGe p-type MOS (pMOS) 103 are formed on a bulk silicon (Bulk) layer 105, as depicted in FIG. 1A. For the purposes of this disclosure, high-Ge content is defined as at least 50%, low-Ge content is defined as less than 10%, and intermediate-Ge content is defined as anything between high and low Ge content. Adverting to FIG. 1B, a dual channel formed of a Si nMOS 121 and a high-Ge content SiGe pMOS 123 is formed over an intermediate-Ge content SiGe SRB (strain relaxed buffer) 125 and a Bulk layer 127. FIGS. 1A and 1B use bulk substrate and, therefore, have advantages in terms of substrate cost. However, forming the device of FIG. 1A is difficult because the high-Ge content SiGe is compressed on the Si substrate, which is not beneficial for an nFET. In addition, nFET gate and contact issues have not been solved. Similarly, forming the device of FIG. 1B is difficult because SRB technology has not sufficiently matured yet. Nevertheless, the use of the intermediate-Ge content SiGe SRB as depicted in FIG. 1B is advantageous because it can provide compressively stressed, high mobility pMOS channels with high-Ge contents and tensile stressed, high mobility nMOS devices with low (or no) Ge channels.

A known approach for forming a complimentary MOS (CMOS) is illustrated in FIGS. 2A and 2B. In particular, on the nFET side, a strained Si channel 201 and an intermediate-Ge content SRB 203, e.g., SiGe25, are formed over a Si substrate 205 and on the pFET side, a strained high-Ge content channel 207, e.g., SiGe50, and an intermediate-Ge content SRB 209, e.g., SiGe25, are formed over a Si substrate 211. However, there is often Ge diffusion at high temperature between different Ge concentrations, e.g., between the strained SiGe50 channel 207 and the SiGe25 SRB 209. In addition, the respective band-offset isolation between the strained Si channel 201 and the intermediate-Ge content SRB and the strained intermediate-Ge content channel and the intermediate-Ge content SRB may not be sufficient to prevent leakage. For example, a 25% concentration of Ge provides about 150 micro volt (mV) offset, which is insufficient from a device point of view, and increasing the Ge concentration delta fails due to lattice mismatch.

In addition, as CMOS devices continue to be decreased in size and scaled, current FinFET devices may not sufficiently reduce off-leakage current. A known approach to address this issue is the formation of nanowire devices. However, because most nanowire devices rely on a single material for both nFET and pFET similar to FIG. 1A, such devices are unable to provide the requisite channel strain.

A need therefore exists for methodology enabling formation of a FinFET device and a nanowire device each having dual-strained pMOS and nMOS from a common SRB, and the resulting devices.

SUMMARY

An aspect of the present disclosure is a dual-strained Si and SiGe FinFET device with dielectric isolation.

Another aspect of the present disclosure is a dual-strained nanowire device.

A further aspect of the present disclosure is a method of forming either a FinFET device with dielectric isolation or a nanowire device from a tensile strained Si/SiGe stack and a compressive strained Si/SiGe, each formed on a SiGe SRB.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including: a SiGe SRB formed on a silicon substrate, the SRB having a first region and a second region; a first and a second dielectric isolation layer formed on the first region and on the second region of the SiGe SRB, respectively; a tensile strained Si fin formed on the first dielectric isolation layer; a compressive strained SiGe fin formed on the second dielectric isolation layer; first source/drain regions formed at opposite sides of the tensile strained Si fin; second source/drain regions formed at opposite sides of the compressive strained SiGe fin; a first replacement metal gate (RMG) formed between the first source/drain regions; and a RMG formed between the second source/drain regions.

Aspects of the device include the SiGe SRB being formed of an intermediate concentration of Ge. Other aspects include the first and the second dielectric isolation layers being formed of silicon dioxide ($SiO_2$). Further aspects include the SiGe fin being formed of a high concentration of Ge.

Another aspect of the present disclosure is a device including: a SiGe SRB formed on a silicon substrate, the SRB having a first region and a second region; two or more tensile strained Si nanowires formed above the SRB first region; two or more SiGe nanowires formed above the SRB second region; first and second u-shaped nitride spacer formed on opposite ends of the Si and SiGe nanowires, the first and the second u-shaped nitride spacers each having a first wall closest to the Si and SiGe nanowires and a second wall furthest from the Si and SiGe nanowires; a first shallow trench isolation (STI) layer formed on the SiGe SRB and a second STI layer formed within each u-shaped nitride spacer; a first high-k metal gate (HKMG) wrapped around the two or more tensile strained Si nanowires; a second HKMG wrapped around the two or more compressive strained SiGe nanowires; and first and second source/drain regions formed on opposite sides of the first and the second HKMG, respectively.

Aspects of the device include the SiGe SRB being formed with an intermediate concentration of Ge. Other aspects include the two or more SiGe nanowires being formed with a high concentration of Ge.

A further aspect of the present disclosure is a method including: forming a SiGe SRB on a silicon substrate, the SiGe SRB having a first region and a second region; forming a tensile strained Si/SiGe stack on the SRB first region; forming a compressive strained Si/SiGe stack on the SRB second region; forming a first fin from the tensile strained Si/SiGe stack and the SiGe SRB and a second fin from the compressive strained Si/SiGe stack and SiGe SRB; anchoring portions of the first and second fins; and removing the SiGe from the Si/SiGe stack on the first region and the Si from the Si/SiGe stack on the second region, forming first and second tunnels, respectively.

Aspects of the present disclosure include forming the SiGe SRB with an intermediate concentration of Ge. Other aspects include forming the tensile strained Si/SiGe stack by: forming two or more first Si layers on the SiGe SRB first region; and forming a first SiGe layer between each adjacent pair of first Si layers. Further aspects include forming each first SiGe layer with a high concentration of Ge. Another aspect includes forming the compressive strained Si/SiGe stack by: forming two or more second Si layers on the SiGe SRB second region; and forming a second SiGe layer on each second Si layer. Additional aspects include forming each second SiGe layer with a high concentration of Ge. Other aspects include anchoring portions of the first and second fins by: forming an oxide layer around and between the first and second fins; and recessing the oxide layer between the first fins and between the second fins. Further aspects include filling the first and second tunnels with first and second dielectric layers, respectively. Another aspect includes filling the first and second tunnels with first and second dielectric layers by: forming a first hard mask on the oxide layer on the SiGe SRB second region; recessing the oxide layer between the first fins to reveal each first SiGe layer; selectively removing each first SiGe layer; conformally filling each first tunnel with $SiO_2$ forming a first dielectric layer; removing the first hard mask; forming a second hard mask on the oxide layer on the SiGe SRB first region; recessing the oxide layer between the second fins to reveal each second Si layer; selectively removing each second Si layer; conformally filling each second tunnel with $SiO_2$, forming a second dielectric layer; removing the second hard mask; and recessing any remaining oxide around and between the first and second fins. Additional aspects include anchoring portions of the first and second fins further by forming a dummy gate across and perpendicular to the first and second fins, the dummy gate formed down to the oxide layer. Other aspects include forming and filling the first and second tunnels with first and second dielectric layers, respectively, by: selectively etching each first SiGe layer; selectively etching each second Si layer; and conformally filling each first and second tunnel with $SiO_2$, forming first and second dielectric layers, respectively. Further aspects include anchoring portions of the first and second fins further by: removing an edge portion of the oxide layer down to the SiGe SRB along ends of the first and second fins; forming a u-shaped nitride spacer on the SiGe SRB adjacent to and perpendicular to each end of the first and second fins, each u-shaped nitride spacer having first and second walls; and forming a second oxide layer between the first and second walls of the u-shaped nitride spacers. Another aspect includes forming first and second sets of nanowires by: recessing the first and second oxide layers to a depth below the two or more first Si layers on the SiGe SRB first region; selectively etching each first SiGe layer, leaving a first set of nanowires; and selectively etching each second Si layer, leaving a second set of nanowires.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3 through 10 schematically illustrate a process flow for forming a dual-strained Si and SiGe FinFet device with dielectric isolation using an STI anchoring process, in accordance with an exemplary embodiment;

FIGS. 3 through 6 and 11A through 14C schematically illustrate a process flow for forming a dual-strained Si and SiGe FinFet device with dielectric isolation using a gate (PC) anchoring process, in accordance with another exemplary embodiment; and FIGS. 15A through 21B schematically illustrate a process flow for forming a dual-strained nanowire device, in accordance with an exemplary embodiment.

DETAILED DESCRIPTION

Figure 1A:
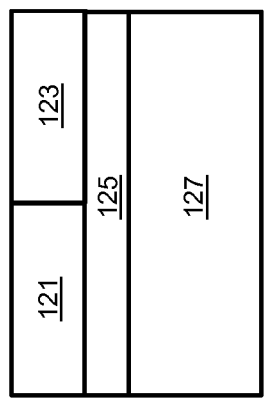
FIGS. 1A and 1B schematically illustrate background options for forming a FinFET device.
Figure 1B:
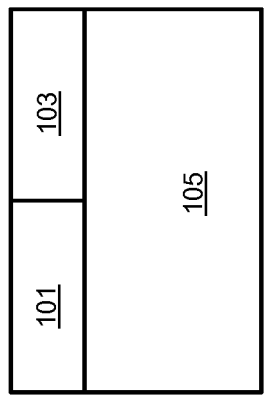
Figure 2A:
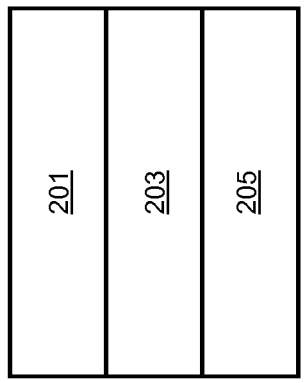
FIGS. 2A and 2B schematically illustrate a background CMOS device having an SiGe SRB on both the nFET and pFET side.
Figure 2B:
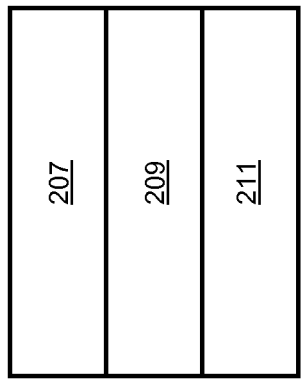

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of Ge diffusion at high temperature between different Ge concentrations and insufficient band-offset isolation to prevent leakage attendant upon the use of both SiGe with a high concentration of Ge and Si on a common SiGe SRB. The present disclosure also addresses and solves the current problem of insufficient channel strain attendant upon forming nanowire devices of a single material for both nFET and pFET.

Methodology in accordance with embodiments of the present disclosure includes a SiGe strained relaxed buffer SRB being formed on a silicon substrate, the SRB having a first region and a second region. First and second dielectric isolation layers are formed on the first and second regions of the SiGe SRB, respectively. A tensile strained Si fin is formed on the first dielectric isolation layer and a compressive strained SiGe fin is formed on the second dielectric isolation layer. First source/drain regions are formed at opposite sides of the tensile strained Si fin and second source/drain regions are formed at opposite sides of the compressive strained SiGe fin. A first RMG is formed between the first source/drain regions and a second RMG is formed between the second source/drain regions.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Adverting to FIG. 3, a SiGe SRB 301 with intermediate-Ge content, e.g., SiGe25, is formed on a silicon substrate 303. The SiGe SRB 301 may be grown, for example, with a low threading dislocation density (TDD), e.g., $10^{-4}$ or lower. The SiGe SRB 301 may be formed, for example, to a thickness of 100 nm or thicker (preferably 10 times greater than the subsequently formed channel thickness). Next, on the nFET side, a sacrificial SiGe layer 401 with high-Ge content, e.g., SiGe50, may be formed on the SiGe SRB 301 or an optional Si layer 403 may be formed between the SiGe layer 401 and the SiGe SRB 301, as depicted in FIG. 4. In particular, the SiGe layer 401 may be formed, for example, to a thickness of 5 nm to 15 nm and the optional Si layer 403 may be formed, for example, to a thickness of 2 nm to 8 nm. Thereafter, a Si layer 405 may be formed, for example, to a thickness of 25 nm to 45 nm on the sacrificial SiGe layer 401. The thickness of each individual layer (optional Si layer 403, SiGe layer 401 and Si layer 405) and their total thickness are controlled under a critical thickness before relaxation, in other words, Si/SiGe stack 407 has the same lateral lattice parameter as SiGe SRB 301. Thus, Si layer 405 is under a tensile strain on the nFET side of the SiGe SRB 301. Before or after the formation of Si/SiGe stack 407 on the nFET side, on the pFET side, a sacrificial Si layer 409 may be formed, for example, to a thickness of 10 nm to 20 nm on the pFET side of the SiGe SRB 301. After the formation of the Si layer 409, a SiGe layer 411 with high-Ge content, e.g., SiGe50, may be formed on the Si layer 409, for example, to a thickness of 25 nm to 45 nm. The thickness of each individual layer (Si layer 409 and SiGe layer 411) and their total thickness are controlled under a critical thickness before relaxation, in other words, Si/SiGe stack 413 has the same lateral lattice parameter as SiGe SRB 301. Thus, SiGe layer 411 is under a tensile strain on the pFET side of the SiGe SRB 301. The formation of nFET side Si/SiGe stack 407 and pFET side Si/SiGe stack 413 can be achieved with one or more hard mask and selective area epitaxy.

Figure 5A:
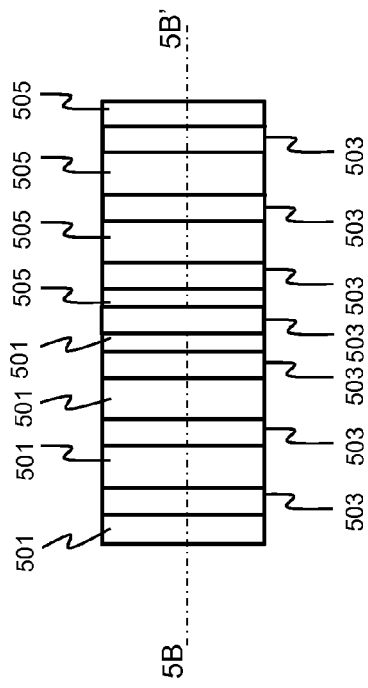
Figure 5B:
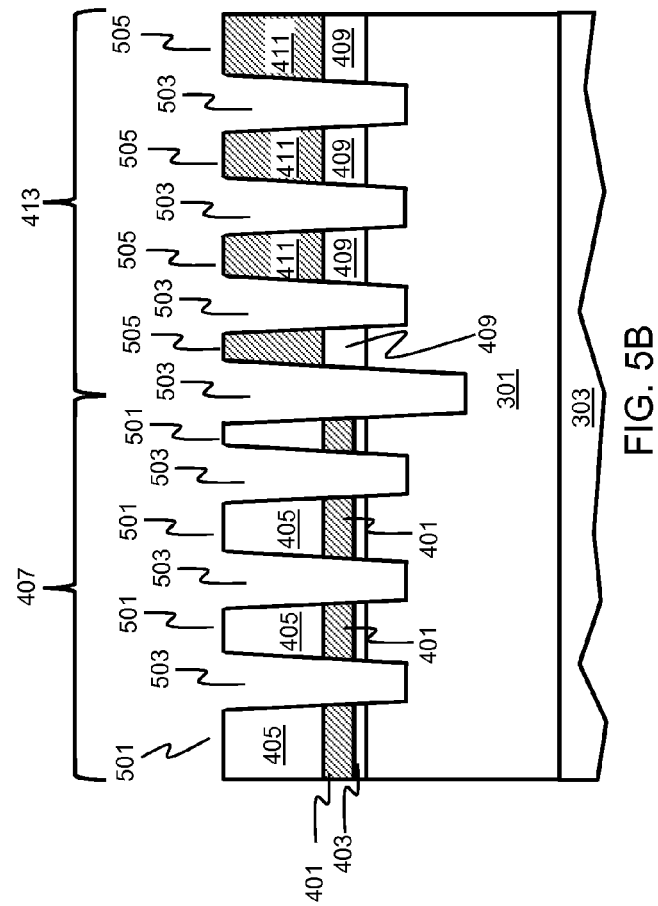

Adverting to FIG. 5A and 5B (FIG. 5A is a top view and FIG. 5B is a cross-sectional view along line 5B-5B' axis), tensile strained Si fins 501 and compressive strained SiGe fins 505 may be formed, for example, by etching trenches 503 in the tensile strained Si/SiGe stack 407 on the nFET side of the SiGe SRB 301 and in the compressive strained Si/SiGe stack 413 on the pFET side of the SiGe SRB 301, respectively. In particular, the fins 501 and 505 may be formed, for example, to approximately 10 nm in width for 10 nm technology nodes and smaller for technology nodes beyond. The trenches 503 may be formed, for example, to a depth of 100 nm to 250 nm.

Figure 6A:
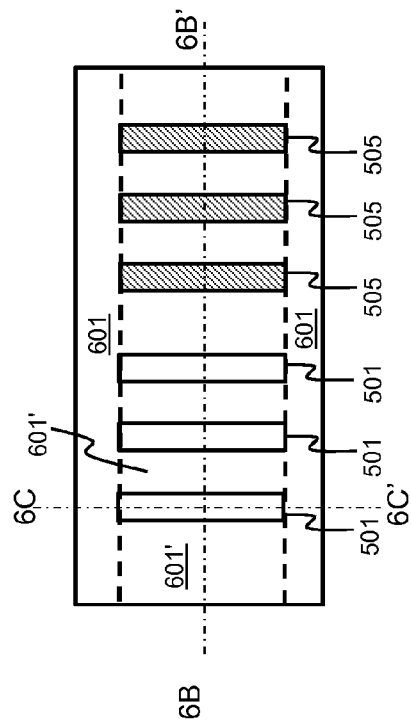
Figure 6B:
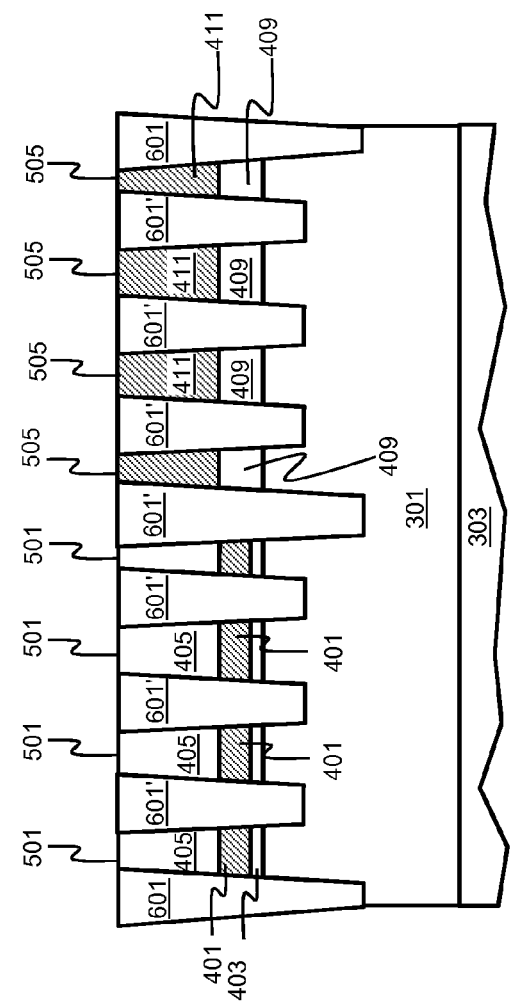
Figure 6C:
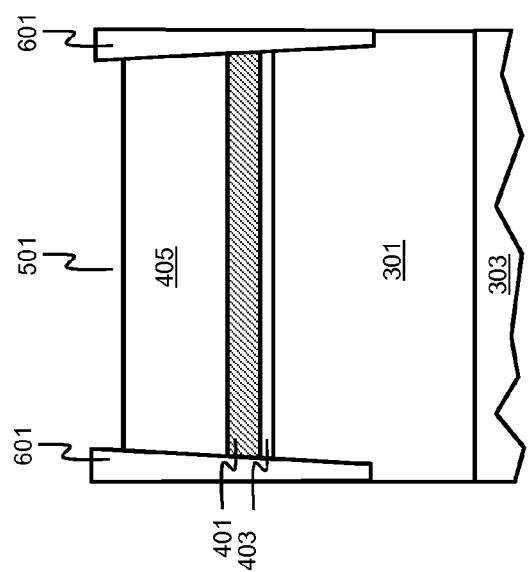

The present disclosure includes two exemplary embodiments for forming the dielectric isolation layer of the dual-strained Si and SiGe FinFET device. The first exemplary embodiment (FIGS. 6A through FIG. 10) includes forming a tall STI layer 601 between and around the fins 501 and 505, as depicted in FIG. 6A. A hardmask, e.g., formed of a nitride (not shown for illustrative convenience), is then formed on the outer edges of the fins 501 and 505 (as depicted by the dashed lines) and the STI layer 601 is recessed forming anchoring STI 601 and STI 601', which is lower than the anchoring STI 601, as depicted in FIGS. 6B and 6C, respectively (FIG. 6A is a top view, FIG. 6B is a cross-sectional view along line 6B-6B', and FIG. 6C is a cross-sectional view along line 6C-6C').

Figure 7A:
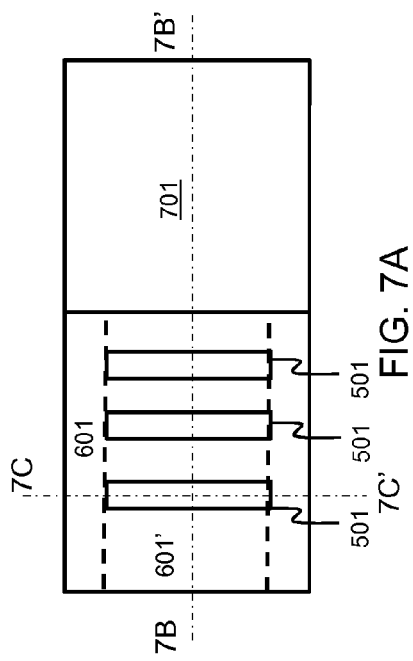
Figure 7B:
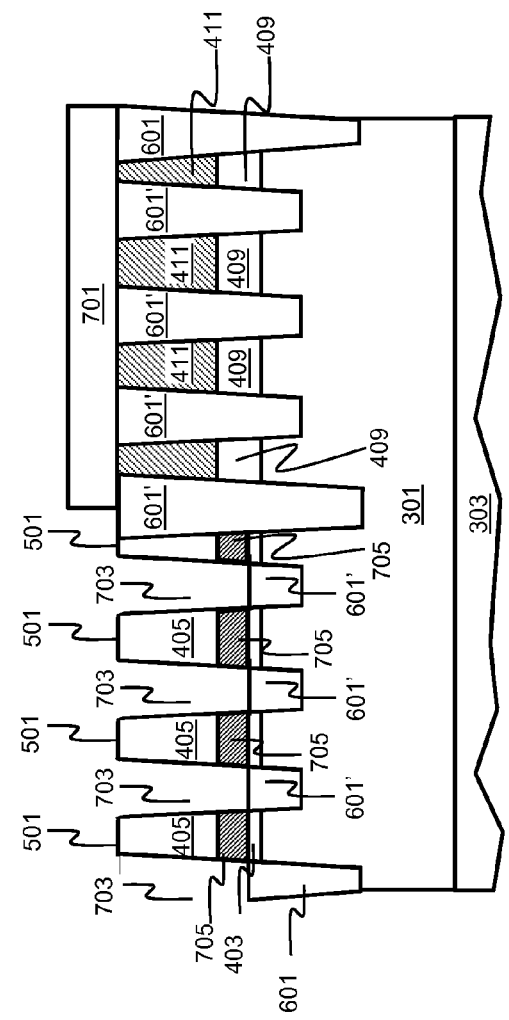
Figure 7C:
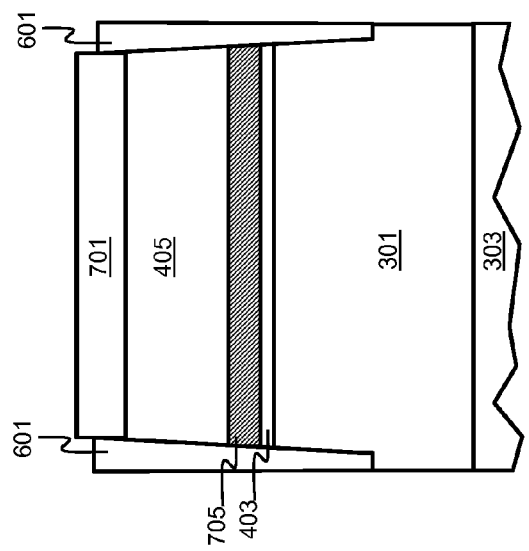

Adverting to FIGS. 7A through 7C (FIG. 7A is a top view, FIG. 7B is a cross-sectional view along line 7B-7B', and FIG. 7C is cross-sectional view along line 7C-7C'), a hardmask 701 is formed on top of the pFET side of the SiGe SDB 301 and the STI 601' is further recessed to reveal the SiGe layer 401 (not shown for illustrative convenience), forming trenches 703. Thereafter, while the fins 501 are still anchored by the anchoring STI 601, the SiGe layer 401 is selectively removed and conformally filled with a SiO$_2$ layer 705, as depicted in FIGS. 7B and 7C. A SiO$_2$ layer 801 is then formed back into the trenches 703, and hardmask 701 may be removed, as depicted in FIGS. 8A through 8C (FIG. 8A is a top view, FIG. 8B is a cross-sectional view along the line 8B-8B', and FIG. 8C is a cross-sectional view along line 8C-8C'). Next, a hardmask 802 is formed on the nFET side of the SiGe SRB 301. Then, the remaining STI 601' is recessed to reveal the Si layer 405 (not shown for illustrative convenience), forming trenches 803, as depicted in FIG. 8B. Thereafter, while the fins 505 are still anchored by the anchoring STI 601, the Si layer 405 is selectively removed and conformally filled with a SiO$_2$ layer 805, as depicted in FIGS. 8B and 8C. The SiO$_2$ dielectric isolation layers 705 and 805 help junction leakage and prevent Ge diffusion.

Figure 9A:
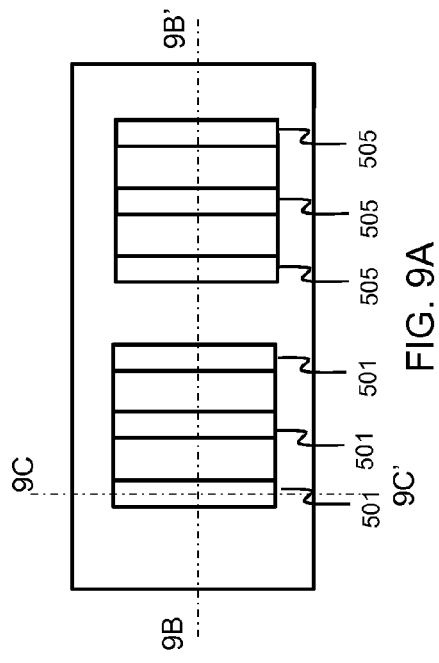
Figure 9B:
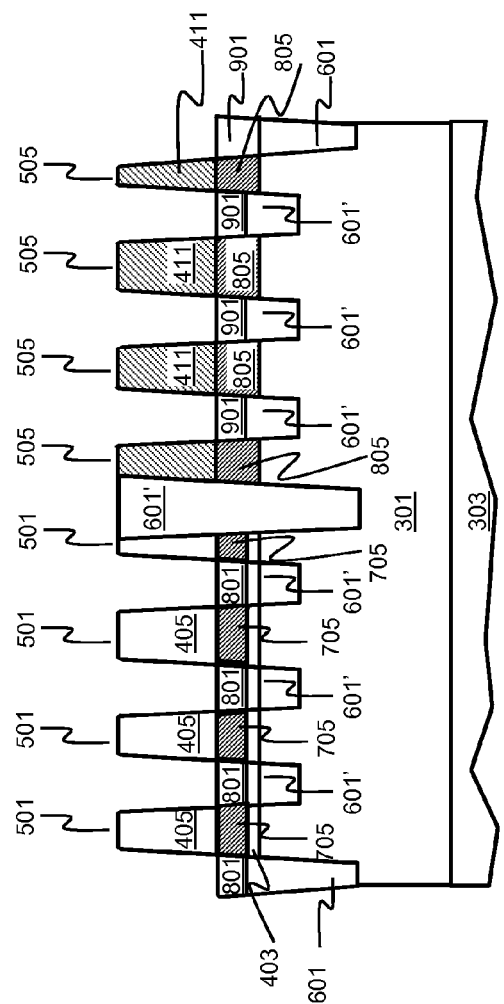
Figure 9C:
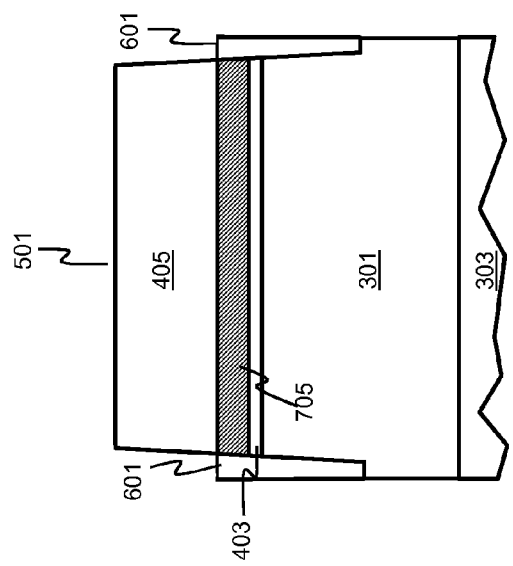

Adverting to FIGS. 9A through 9C (FIG. 9A is a top view, FIG. 9B is a cross-sectional view along line 9B-9B', and FIG. 9C is a cross-sectional view along line 9C-9C'), an SiO$_2$ layer 901 is formed in the trenches 803 (not shown for illustrative convenience), the hardmask 802 is removed, and the SiO$_2$ layers 801 and 901 are recessed to reveal the tensile strained Si fins 501 and the compressive strained SiGe fins 505, now both with dielectric isolation layers 705 and 805, as depicted in FIG. 9B.

Figure 10:
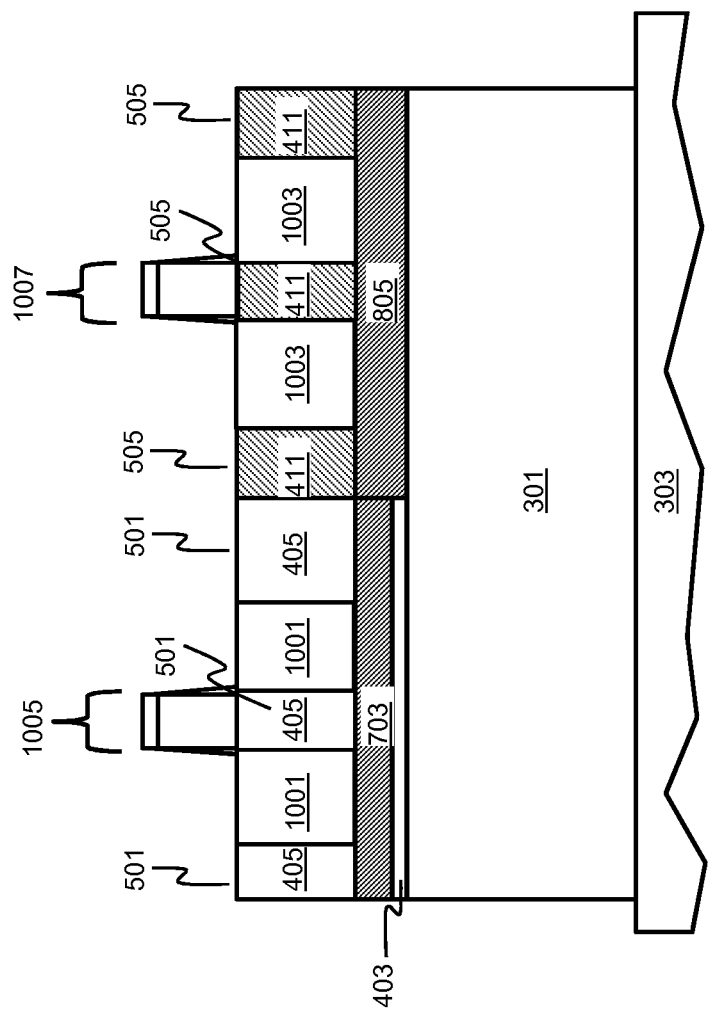

After the fins 501 and 505 have been revealed, dummy gate and spacer (not shown for illustrative convenience) are formed by standard methods. Thereafter, source/drain (S/D) regions 1001 are formed on the tensile strained Si fins 501 and S/D regions 1003 are formed on the compressive strained SiGe fins 505, as depicted in FIG. 10. The S/D regions 1001 may be formed, for example, by epitaxial growth of silicon phosphide (SiP) and the S/D regions 1003 may be formed, for example, by epitaxial growth of boron doped silicon germanium (SiGe:B). In particular, the S/D regions 1001 may be in-situ phosphorous doped (ISPD) and the S/D regions 1003 may be in-situ boron doped with a Ge concentration of 75% to 100%, e.g., SiGe75:B. The S/D regions 1003 may also be formed, for example, by epitaxial growth of germanium tin (GeSn). Next, RMG 1005 and 1007 are formed over fins 501 and 505, between the S/D regions 1001 and 1003, respectively. In addition, S/D regions 1003 may provide additional compressive strain to the SiGe fins 505.

The process flow of the second embodiment follows the same initial steps from nFET stacks 407 and pFET stack 413 forming on SRB 301 in FIGS. 3 and 4, through forming a tall STI layer 601 in FIG. 6 of the first embodiment. Adverting to FIGS. 11A through 11C (FIG. 11A is a top view, FIG. 11B is a cross-sectional view along line 11B-11B', and FIG. 11C is a cross-sectional view along line 11C-11C'), the tall STI layer 601 is recessed until the SiGe layer 401 and the Si layer 409 are exposed, forming STI layer 601' and fins 1101 and 1103, as depicted in FIGS. 11A and 11B.

Figure 12A:
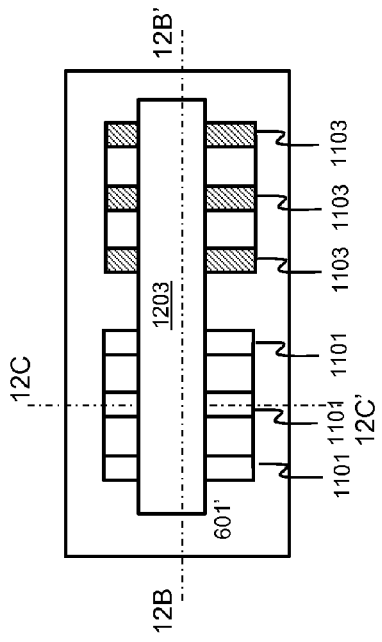
Figure 12B:
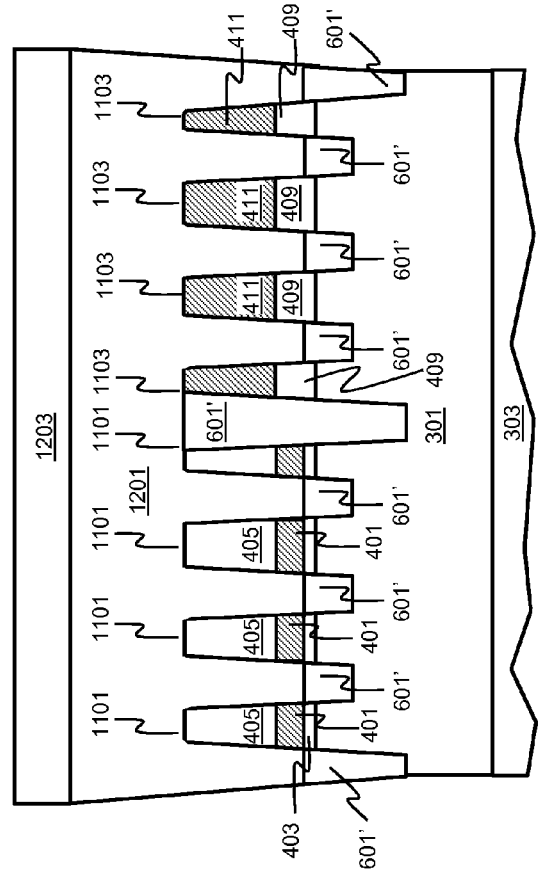
Figure 12C:
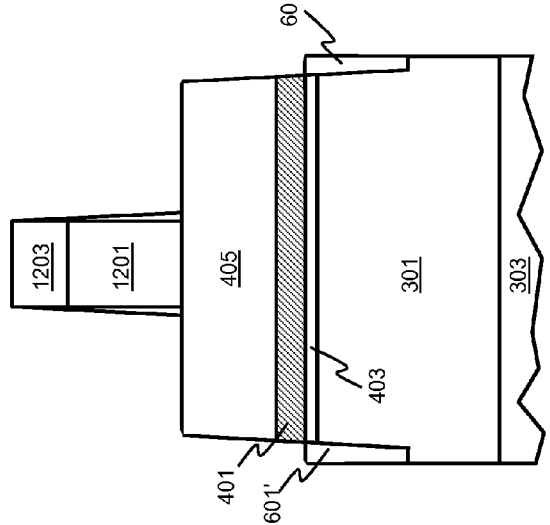

Next, a dummy gate 1201 is formed wrapping around the fins 1101 and 1103 as depicted in FIGS. 12A through 12C (FIG. 12A is a top view, FIG. 12B is a cross-sectional view along line 12B-12B', and FIG. 12C is a cross-sectional view along line 12C-12C'). In particular, the dummy gate 1201 may be formed, for example, of amorphous silicon (a-Si) and may also include a nitride cap 1203.

Figure 14A:
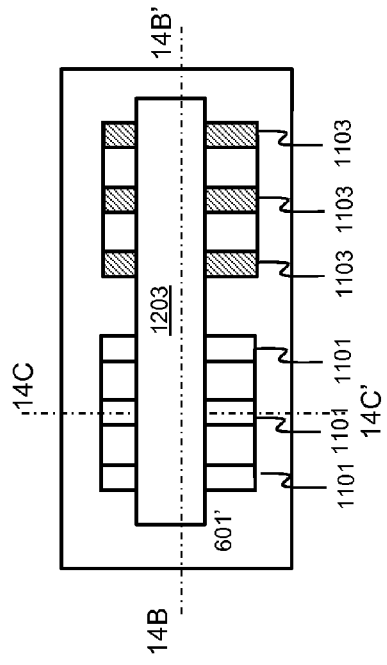
Figure 14B:
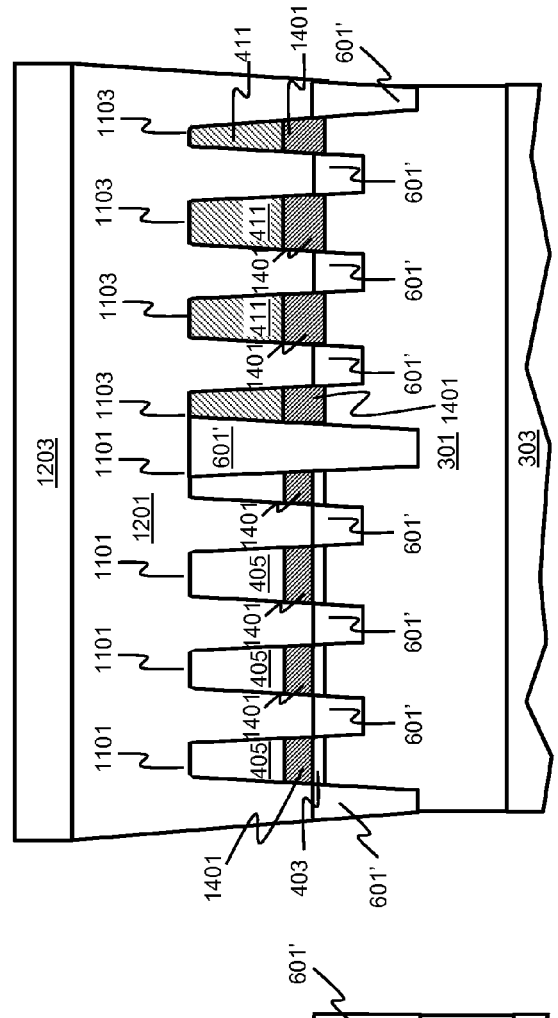
Figure 14C:
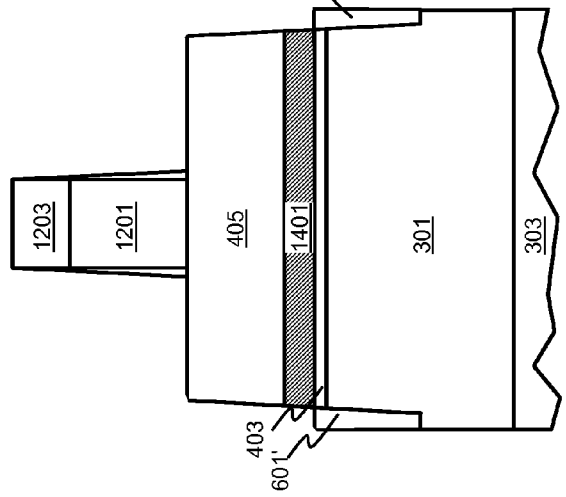

Adverting to FIGS. 13A through 13C (FIG. 13A is a top view, FIG. 13B is a cross-sectional view line 13B-13B', and FIG. 13C is a cross-sectional view along line 13C-13C'), while the dummy gate 1201 anchors the tensile strain of the Si fins 1101 and the compressive strain of the SiGe fins 1103 to the SiGe SRB 301, respectively, the SiGe layer 401 and Si layer 409 are selectively removed forming tunnels 1301. Thereafter, the tunnels 1301 are conformally filled with $SiO_2$ layer 1401, as depicted in FIGS. 14B and 14C, which are cross-sectional views indicated by lines 14B-14B' and 14C-14C', respectively, in the top view shown in FIG. 14A. Once the $SiO_2$ layer 1401 is formed, S/D regions are formed at opposite sides of dummy gate 1201, on fin 1101 and on fin 1103. Then the dummy gate 1201 is removed and replaced with an RMG (not shown for illustrative convenience), resulting in a device similar to that shown in FIG. 10. In particular, the Si fins 1101 are still under tensile strain and the SiGe fins 1103 are under compressive strain, while the $SiO_2$ dielectric isolation layer 1401 helps reduce leakage and prevents Ge diffusion.

Figures 15A, 15B:
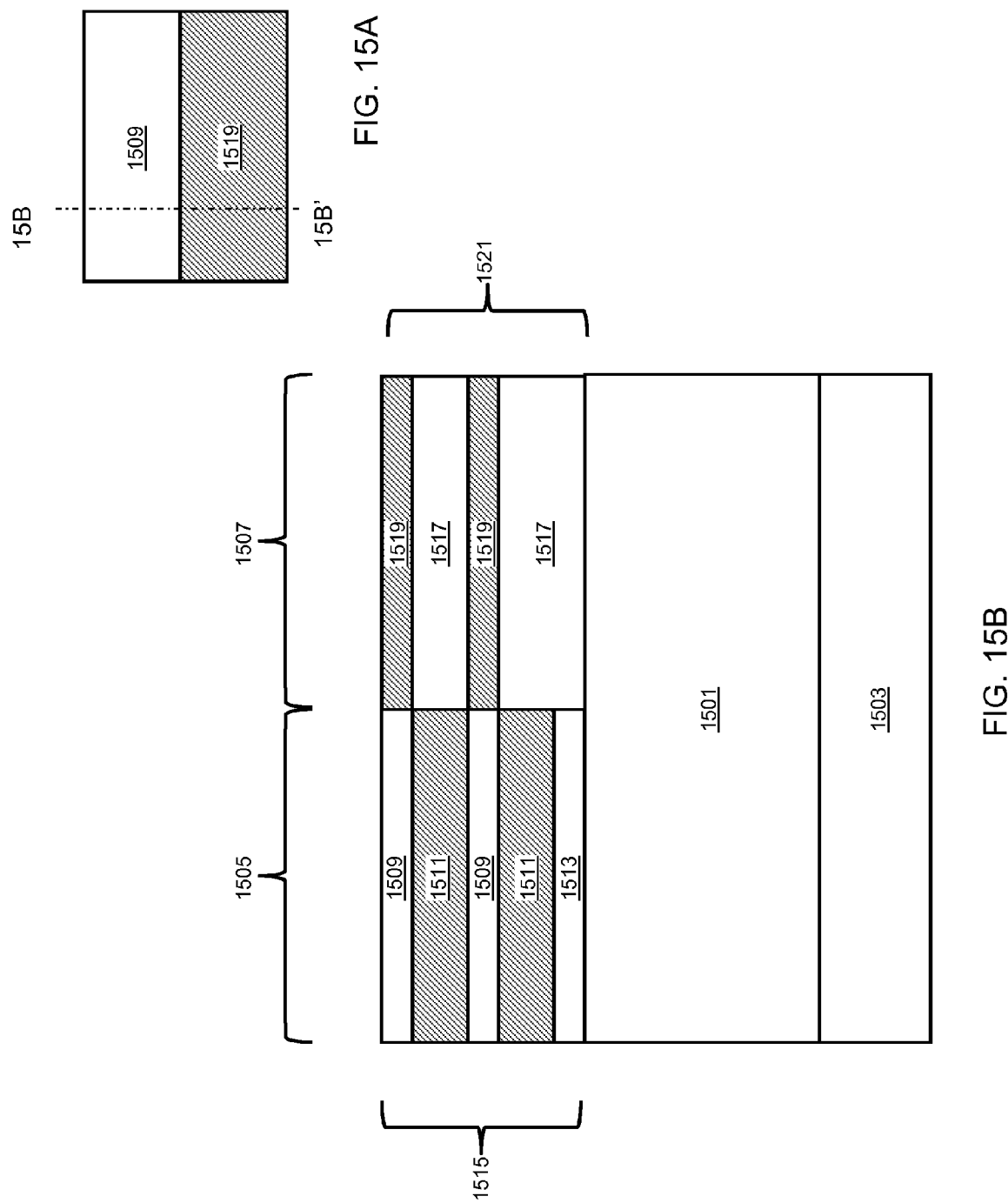

FIGS. 15A through 21B schematically illustrate a process flow for forming a dual-strained nanowire device, in accordance with an exemplary embodiment. Adverting to FIGS. 15A and 15B (FIG. 15A is a top view and FIG. 15B is cross-sectional view along line 15B-15B'), a SiGe SRB layer 1501 with an intermediate-Ge content, e.g., SiGe25, is formed on top of a silicon substrate 1503. The SiGe SRB layer 1501 has an nFET region 1505 and a pFET region 1507. The SiGe SRB 1501 may be formed, for example, to a thickness of 100 nm or thicker (preferably 10 times greater than the subsequently formed channel thickness). Next, two or more Si layers 1509 are each formed on top of a sacrificial SiGe layer 1511 with a high-Ge content, e.g., SiGe50, forming a tensile strained Si/SiGe stack 1515 on the SiGe SRB 1501. Each Si layer 1509 may be formed, for example, to a thickness of 3 nm to 8 nm (thickness of wire) and each SiGe layer 1511 may be formed, for example, to a thickness of 5 nm to 10 nm (thickness of suspension). An additional Si layer 1513 may optionally be formed on top of the SiGe SRB 1501 between the lowermost SiGe layer 1511 and SRB 1501. The additional Si layer 1513 may be formed, for example, to a thickness of 3 nm to 8 nm. Either before or after the formation of the Si/SiGe stack 1515, two sacrificial Si layers 1517 are formed on top of the SiGe SRB 1501 on the pFET region with a SiGe layer 1519 formed on each sacrificial Si layer 1517, forming a compressive strained Si/SiGe stack 1521. Optionally, the sacrificial layers 1511 and 1517 may be formed of other content instead of SiGe and Si, respectively. However, the sacrificial layers must have enough Ge content to enable selective removal without damaging the remaining content. A sacrificial Si layer 1517 may be formed, for example, to a thickness of 5 nm to 10 nm (thickness of suspension) and an SiGe layer 1519 may be formed, for example, to a thickness of 3 nm to 8 nm (thickness of wire). The SiGe SRB 1501 is used to provide original strain to both the tensile strained Si/SiGe stack 1515 and the compressive strained Si/SiGe stack 1521. The thickness of each individual layer (optional Si layer 1513, sacrificial SiGe layer 1511, and Si layer 1509) and their total thickness are controlled under a critical thickness before relaxation. Similarly on pFET side, the thickness of each individual layer (sacrificial Si layer 1517 and SiGe layer 1519) is controlled under a critical thickness before relaxation. Those thicknesses are also optimized for device performance as they decide the thickness of wire and thickness of suspension.

Figure 17A:
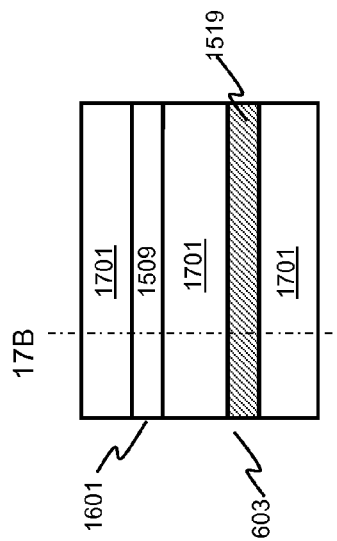
Figure 17B:
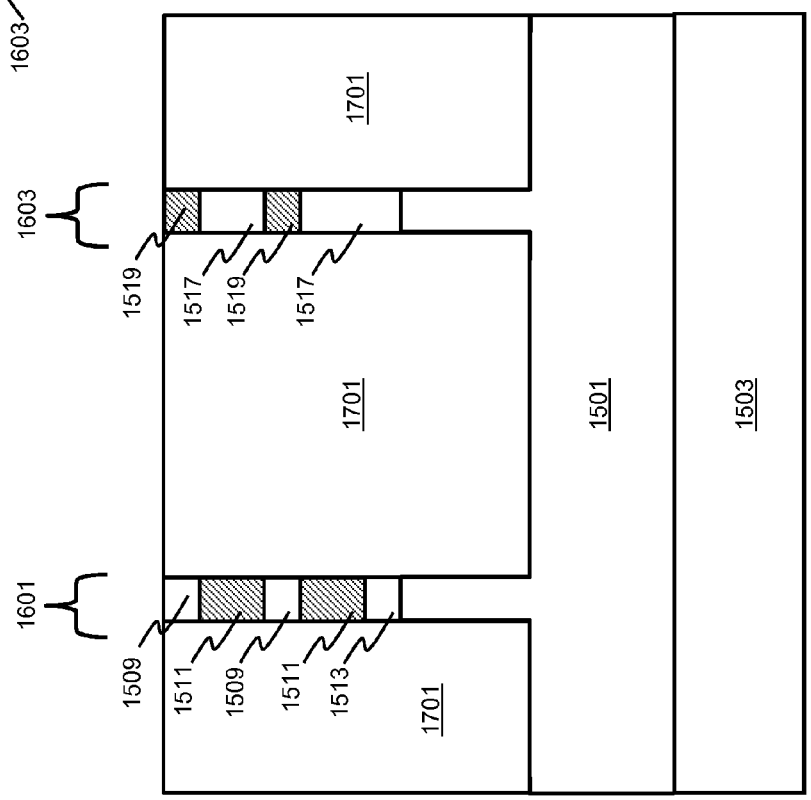
Figure 20:
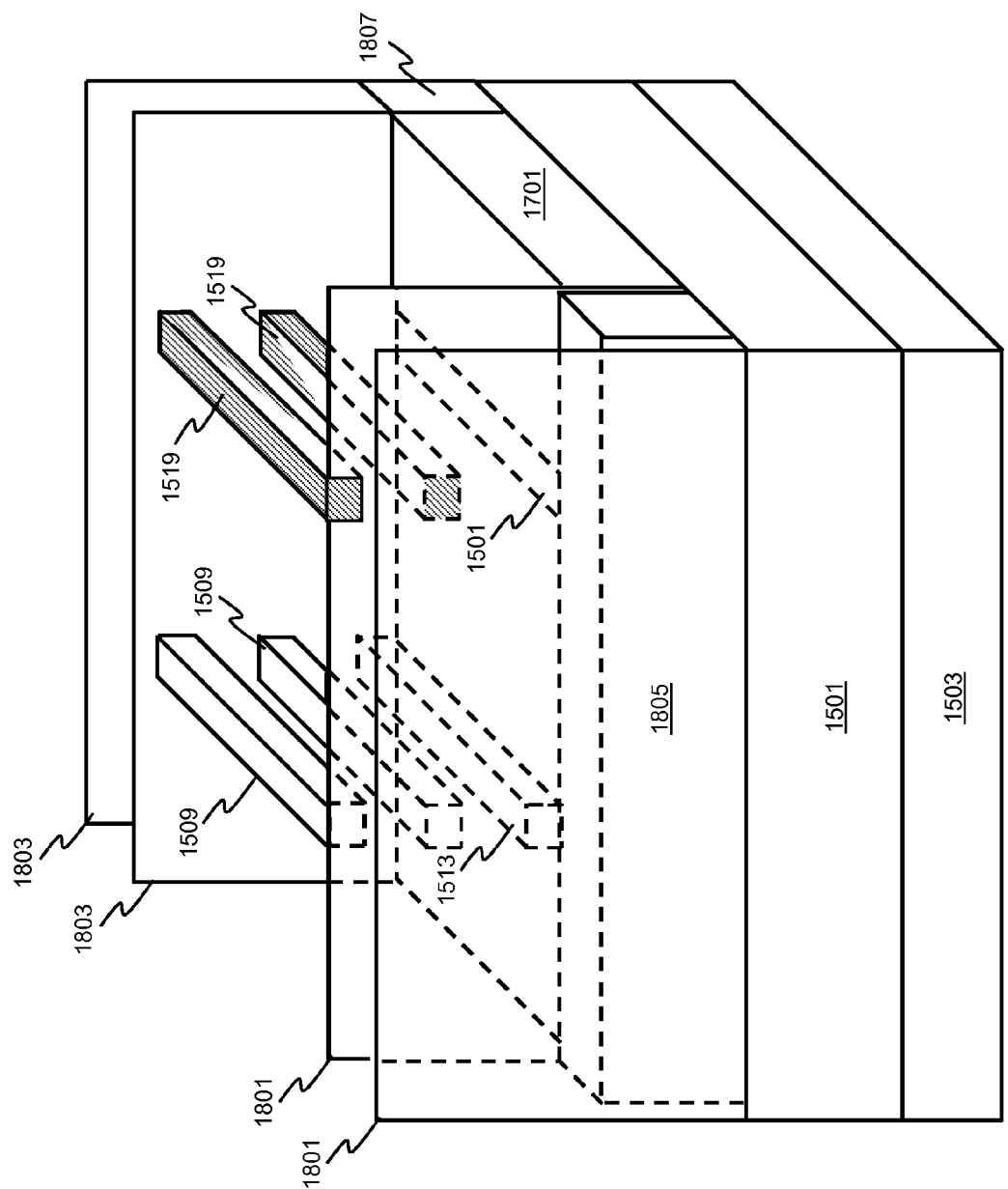

Next, fins 1601 and 1603 are formed by recessing the Si layers 1509, 1513 (if applicable), 1517, the SiGe layers 1511 and 1519, and the SiGe SRB 1501, as depicted in FIGS. 16A and 16B (FIG. 16A is a top view and FIG. 16B is a cross-sectional view along line 16B-16B'). The fins 1601 and 1603 may be formed, for example, to a minimum height to just expose nFET stack 1515 and pFET stack 1521, or higher for deep STI formation. The fins 1601 and 1603 may be formed to a width of 5 nm to 20 nm with device optimization (width of wire). Adverting to FIGS. 17A and 17B (FIG. 17A is a top view and FIG. 17B is a cross-sectional view along the 17B-17B' axis), an STI layer 1701 is formed along each length of the fins 1601 and 1603. Edge portions of the fins 1601 and 1603 and portions of the STI layer 1701 are then removed, and u-shaped nitride spacers 1801 and 1803 are formed on the SiGe SRB 1501 perpendicular to the fins 1601 and 1603, as depicted in FIGS. 18A and 18B (FIG. 18A is a top view and FIG. 18B is a cross-sectional view along line 18B-18B'). Thereafter, STI layers 1805 and 1807 are formed in the u-shaped nitride spacers 1801 and 1803, respectively.

Adverting to FIGS. 19A and 19B (FIG. 19A is a top view, FIG. 19B is a cross-sectional view along line 19B-19B', and FIG. 19C is a cross-sectional view along line 19C-19C' with u-shaped nitride spacer 1803 not shown for illustrative convenience), the STI layers 1701, 1805, and 1807 are recessed down below the bottom-most Si layer 1509 or Si layer 1513, exposing the fins 1601 and 1603. The u-shaped nitride spacers 1801 and 1803 anchor the strain between the fins 1601 and 1603 and the SiGe SRB 1501 during subsequent sacrificial layer removal. The sacrificial SiGe layers 1511 and Si layers 1517 are then removed, forming two or more strained nanowires on each side of the SiGe SRB 1501, as depicted in axonometric FIG. 20. The resulting Si nanowires 1509 and 1513 (if applicable) on the nFET side are tensile strained from the SiGe SRB 1501 and the SiGe nanowires 1519 on the pFET side are compressive strained from the SiGe SRB 1501. In addition, the Si nanowires 1509 and 1513 (if applicable) and the SiGe nanowires 1519 may optionally be etched, e.g., using $H_2$, and baked (not shown for illustrative convenience) to produce rounded nanowires 1509, 1513 (if applicable) and 1519 (not shown for illustrative convenience). Although the nFET Si nanowires 1509 and pFET SiGe nanowires 1519 are formed at the same time in the figure for illustrative convenience, the nFET region and pFET region naonwires are formed sequentially with the help of hard mask and additional STI refill and recess steps. For the nFET region, sacrificial SiGe layer 1511 is selectively removed under Si layer 1509, while for the pFET region, sacrificial Si layer 1517 is selectively removed under SiGe 1519 using different chemicals.

Adverting to FIGS. 21A and 21B (FIG. 21A is a top view and FIG. 21B is a cross-sectional view along line 21B-21B'), HKMGs 2101 and 2013 are formed wrapping around the Si nanowires 1509 and 1513 (if applicable) and the SiGe nanowires 1519, respectively and S/D regions (not shown for illustrative convenience) are formed on opposite sides of the HKMG 2101 and 2013. The S/D regions may be formed by ISPD Si for the nFET side of the SiGe SRB 1501 and ISBD Ge (or higher Ge % SiGe, or GeSn) for the pFET side of the SiGe SRB 1501.

The embodiments of the present disclosure can achieve several technical effects including maintaining the dual-strain (tensile for n- and compressive for p-) of the fins throughout the process flow by either STI anchoring or PC anchoring the fins to the SRB. In addition, dielectric isolation layers formed under the fins reduce leakage and Ge diffusion across the SiGe and Si layers. Further, forming the nanowires of a dual material, e.g., Si for n- and SiGe for p-, and maintaining the dual strain, e.g., tensile for n- and compressive for p-, throughout the process flow can boost performance for both nFET and pFET. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in 7 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein. In a particular example, the process flows illustrated in FIGS. 5 through 9, FIGS. 11 through 14, and FIGS. 15 through 20 (namely, various sacrificial layer removal and strain anchoring methods) can be interchangeably used in practice with modification to consider the difference between nanowires and fins by those having ordinary skill in the art upon examination.

What is claimed is:

1. A method comprising:
   forming a silicon germanium (SiGe) strained relaxed buffer (SRB) on a silicon substrate, the SiGe SRB having a first region and a second region;
   forming a tensile strained silicon (Si)/SiGe stack on the SRB first region;
   forming a compressive strained Si/SiGe stack on the SRB second region;
   forming a first fin from the tensile strained Si/SiGe stack and the SiGe SRB and a second fin from the compressive strained Si/SiGe stack and SiGe SRB;
   anchoring portions of the first and second fins; and
   removing the SiGe from the Si/SiGe stack on the first region and the Si from the Si/SiGe stack on the second region, forming first and second tunnels, respectively.

2. The method according to claim 1, comprising forming the SiGe SRB with an intermediate concentration of germanium (Ge).

3. The method according to claim 1, comprising forming the tensile strained Si/SiGe stack by:
   forming two or more first Si layers on the SiGe SRB first region; and
   forming a first SiGe layer between each adjacent pair of first Si layers.

4. The method according to claim 3, comprising forming each first SiGe layer with a high concentration of Ge.

5. The method according to claim 1, comprising forming the compressive strained Si/SiGe stack by:
   forming two or more second Si layers on the SiGe SRB second region; and
   forming a second SiGe layer on each second Si layer.

6. The method according to claim 5, comprising forming each second SiGe layer with a high concentration of Ge.

7. The method according to claim 1, wherein anchoring portions of the first and second fins comprises:
   forming an oxide layer around and between the first and second fins; and
   recessing the oxide layer between the first fins and between the second fins.

8. The method according to claim 1, further comprising filling the first and second tunnels with first and second dielectric layers, respectively.

9. The method according to claim 8, comprising filling the first and second tunnels with first and second dielectric layers by:
   forming a first hard mask on the oxide layer on the SiGe SRB second region;
   recessing the oxide layer between the first fins to reveal each first SiGe layer;
   selectively removing each first SiGe layer;
   conformally filling each first tunnel with silicon dioxide ($SiO_2$) forming a first dielectric layer;
   removing the first hard mask;
   forming a second hard mask on the oxide layer on the SiGe SRB first region;
   recessing the oxide layer between the second fins to reveal each second Si layer;
   selectively removing each second Si layer;
   conformally filling each second tunnel with $SiO_2$, forming a second dielectric layer;
   removing the second hard mask; and
   recessing any remaining oxide around and between the first and second fins.

10. The method according to claim 1, wherein anchoring portions of the first and second fins further comprises:
    forming a dummy gate across and perpendicular to the first and second fins, the dummy gate formed down to the oxide layer.

11. The method according to claim 10, comprising forming and filling the first and second tunnels with first and second dielectric layers, respectively, by:
    selectively etching each first SiGe layer;
    selectively etching each second Si layer; and
    conformally filling each first and second tunnel with $SiO_2$, forming first and second dielectric layers, respectively.

12. The method according to claim 1, wherein anchoring portions of the first and second fins further comprises:
    removing an edge portion of the oxide layer down to the SiGe SRB along ends of the first and second fins;
    forming a u-shaped nitride spacer on the SiGe SRB adjacent to and perpendicular to each end of the first and second fins, each u-shaped nitride spacer having first and second walls; and
    forming a second oxide layer between the first and second walls of the u-shaped nitride spacers.

13. The method according to claim 12, comprising forming first and second sets of nanowires by:
    recessing the first and second oxide layers to a depth below the two or more first Si layers on the SiGe SRB first region;

selectively etching each first SiGe layer, leaving a first set of nanowires; and selectively etching each second Si layer, leaving a second set of nanowires.

* * * * *